United States Patent [19]

Grivérus

[11] 4,061,030
[45] Dec. 6, 1977

[54] METHOD AND DEVICE FOR CORRECTING THE OUTPUT SIGNAL FROM A DIGITAL TRANSDUCER FOR MEASURING A PHYSICAL MAGNITUDE OR VARIABLE

[76] Inventor: Tor Lennart Bernt Grivérus, Nasbydalsvagen 6, 183 31 Taby, Sweden

[21] Appl. No.: 709,432

[22] Filed: July 28, 1976

Related U.S. Application Data

[63] Continuation-in-part of Ser. No. 522,789, Sept. 7, 1976, Pat. No. 3,978,727.

[30] Foreign Application Priority Data

Nov. 9, 1973 Sweden ................................ 7315252

[51] Int. Cl.² .............................................. G01F 1/05
[52] U.S. Cl. .............................. 73/194 E; 235/92 FL; 73/229
[58] Field of Search ............................ 73/229, 194 E; 235/92 FL, 92 PL, 92 MT

[56] References Cited

U.S. PATENT DOCUMENTS

| | | | |
|---|---|---|---|
| 3,425,274 | 2/1969 | Clement et al. | 73/194 M |
| 3,566,685 | 3/1971 | Zimmerman et al. | 73/194 M |
| 3,605,497 | 9/1971 | Zimmerman et al. | 73/229 |
| 3,705,295 | 12/1972 | Betz | 235/92 PL |

Primary Examiner—Charles A. Ruehl
Attorney, Agent, or Firm—Blanchard, Flynn, Thiel, Boutell & Tanis

[57] ABSTRACT

A method and circuit is provided for correcting an output signal pulse train received from a digital transducer representing a physical magnitude. In a graph the relationship of pulse frequency versus said magnitude will be illustrated by a straight line which will not, due to various influences, intersect the origin of the graph but will pass on either side thereof. By superimposing (adding or subtracting) correction pulses on the transducer pulses, said line is displaced and caused to intersect the origin, said relationship thus being changed to a directly proportional one. Conditions for proper superimposition are defined and an electronic circuit for fulfilling the conditions in a simple and reliable way is disclosed.

11 Claims, 7 Drawing Figures

METHOD AND DEVICE FOR CORRECTING THE OUTPUT SIGNAL FROM A DIGITAL TRANSDUCER FOR MEASURING A PHYSICAL MAGNITUDE OR VARIABLE

This application is a continuation-in-part of U.S. application Ser. No. 522,789 filed 11/11/74, issued Sept. 7, 1976 as U.S. Pat. No. 3,978,727.

The present invention relates to a method for correcting an output signal in the form of a pulse train from a digital transducer for measuring a physical magnitude or variable, and the invention also relates to a device for carrying out the method.

It occurs in many cases where there are accurately working measuring instruments, that these give output signals, between which and the measuring magnitude in question there exists an accurate linear relationship, which may be termed the "measuring characteristic" of the instrument (i.e. a curve showing signal versus magnitude) consisting of a straight line. Due to friction, other physical conditions, inherent qualities of the instrument etc. the output signals are, however, in reality not directly proportional to the measurement variable. In other words, the characteristic of the instrument or its extension will not cut through the origin of the coordinates required for plotting the characteristic, but will pass to one side of it. This causes an inconvenience, especially when the transducer signal has the form of a pulse train, where the pulses are counted and registered by adding means or counters, which operate with direct proportionality themselves.

The invention has the object of providing a correction for the pulse train sent by a transducer of this kind, so that the pulse train will be directly and accurately proportional to the measurement magnitude over the whole of the working range of the transducer. This object is achieved by providing the method according to the invention with the distinguishing features disclosed in claim 1.

The invention will now be described, by way of example, with reference to the attached drawings, in which FIG. 1 shows a typical example of a measurement characteristic, i.e. a graph, in this case a straight line, over the frequency of transducer pulses caused by a measurement magnitude, as a function of the true value of the measurement magnitude, the figure illustrating the conditions in known techniques.

Figure 1:
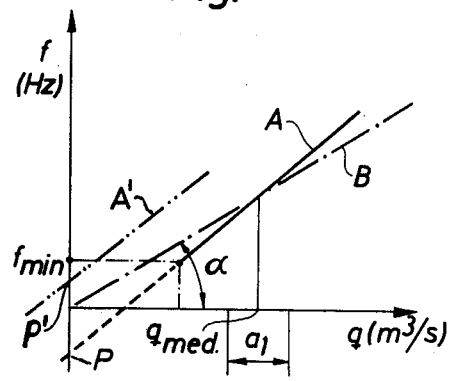

The problems connected with earlier techniques, indicated in the introduction, will be illustrated briefly with reference to FIG. 1, which shows the characteristic for an instrument of the kind where the invention is intended to be applied, i.e. an instrument wherein the transducer sends a pulse train where the frequency of the pulses is linearly proportional to the measurement magnitude.

As an example, a flow-meter for measuring a volume flow $q$ $m^3/s$ is chosen, wherein the transducer or indicator has the shape of a rotor or a circulating (orbiting) ball, the revolutions of which (frequency) f Hz are measured in a known and suitable way. The characteristic obtains the form of a straight line, and this is shown in FIG. 1 as a full line A, whereat it should be noted that the line starts from a lowest value $f_{min}$ corresponding to a lowest volume flow $q_{min}$, i.e. the latter value represents the lowest volume flow which is required for the instrument to start or which is measured practically. In other words, $q_{min}$ determines the lower limit of the working range. If the line is extended (note the dashed part of line A) it will as a result of various drag factors, primarily hydraulic losses, cut the axis of ordinates at one side of the origin, that is to say at point P below the origin.

It should be noted here that there are also cases when the rectilinear characteristic cuts the axis of ordinates above the origin, as indicated by the double dot-dashed line A' in FIG. 1, which line cuts the axis of ordinates at a point P' above the origin. Several physical transducers exhibiting this characteristic feature exist, and as far as flow-meters are concerned there are such of the hydrodynamic oscillation type, e.g. so called vortex shedding flow-meters, without moving parts and whose characteristics intersect the axis of ordinates at points above the origin. However, as far as the invention is concerned it is insignificant whether the intersecting point lies above or below the origin, as will be clearly understood from the following.

For the reproduction of $f$ is conventionally used an integrating or direct indicating device, e.g. an adder for summing the pulses sent, the pulses stepping up the adder in a known way. Since the line A is straight, the transmitted frequency $f$ will be proportional to the volume flow $q$, but since the line does not cut the origin, the frequency will not be directly proportional to $q$. The counter or adder, on the other hand, will register in direct proportion to received signals, its own characteristic thus starting from zero. To compensate this proportionality deviation, the adder is normally adapted so that its characteristic, note the dot-dashed line B in FIG. 1, is given such a slope $a$, i.e. the adder is given a proportionality factor $K = \tan a$, that it intersects the transducer characteristic A at approximately the middle, $q_{med}$, of the desired working range. Measurement errors are obviously obtained thereby, these errors increasing towards the boundaries of the working range, and since in most cases only moderate errors can be accepted, the working range will be reduced to a very small area $q_{med}$, as is noted by $a_1$ in FIG. 1, this being something which naturally means great inconvenience in practice.

Figure 2:
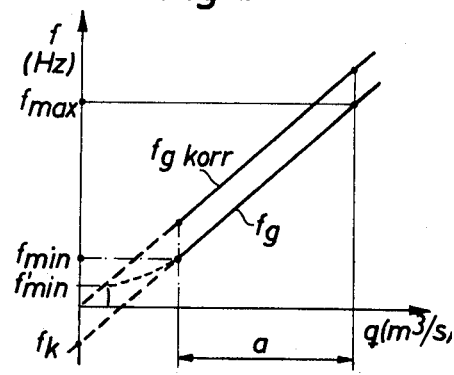
FIG. 2 is a figure corresponding to FIG. 1 but shows how the correction of the measurement characteristic is carried out according to the invention.

The invention intends instead to achieve a complete correction of the transducer signals, which means that they will not only be proportional but even directly proportional to the measurement magnitude, without the meter loosing any of its measurement accuracy. In other words, the extension of the characteristic will cut the origin. The correction is obtained by the manner, simple in principle, of superimposing the transducer frequency with a definite but adjustable correction frequency, whereby the characteristic will be displaced upwardly, and is hereby so adjusted that the extension of the characteristic cuts the origin. This is illustrated in FIG. 2 where the uncorrected frequency of the transducer is denoted by a line $f_g$ (corresponding to the line A in FIG. 1) while the corrected frequency is shown by a line $f_{g\ korr}$. The constant frequency which is added to the transducer frequency is denoted by $f_k$, and thus obtained:

$$f_{g\ korr} = f_g + f_k$$

Within the working range, which extends from a lowest value $f_{min}$ to a desired upper boundary $f_{max}$, and which is denoted by $a$ in FIG. 2, the corrected transducer frequency $f_{g\ korr}$ will thus be directly proportional to $q$, over the whole range.

In the light of the above it should be obvious why it makes no difference in principle whether the uncorrected characteristic cuts the axis of ordinates below or above the origin (lines A and A', respectively, in FIG. 1). In the last mentioned case the necessary correction frequency has only to be subtracted from instead of added to the uncorrected frequency of the transducer. The term "superimposition" and its derivatives are thus used in the specification and claims in their general mathematical sense, meaning that the magnitudes under consideration are combined with their proper signs.

To achieve the desired parallel displacement of the transducer characteristic, the procedure adopted according to the invention is such that a pulse generator is arranged which sends pulses with the desired correction frequency $f_k$, and which is connected to the transducer output. Certain definite conditions apply for the connection, and these must be met for frequency superimposition with the desired parallel displacement of the transducer characteristic to take place without error. There are chiefly three conditions. Firstly, correction pulses must not be sent if transducer pulses do not occur, and this condition can be formulated so that correction pulses may only be sent after a transducer pulse has been sent. Secondly, a transducer pulse and a correction pulse must not coincide, since the adder will then only register one pulse, while correct superimposition requires two pulses to be registered; registering and correction pulses which completely or partly coincide must therefore be separated so that the adder can distinguish two pulses. Thirdly, correction pulses must not continue to be sent after the instrument transducer or indicator has stopped, or, if the transducer were to carry on below $f_{min}$, i.e. outside the lower boundry of the working range, the correcting pulses consequent on each transducer pulse would have to be limited to a maximum amount.

Figure 3:
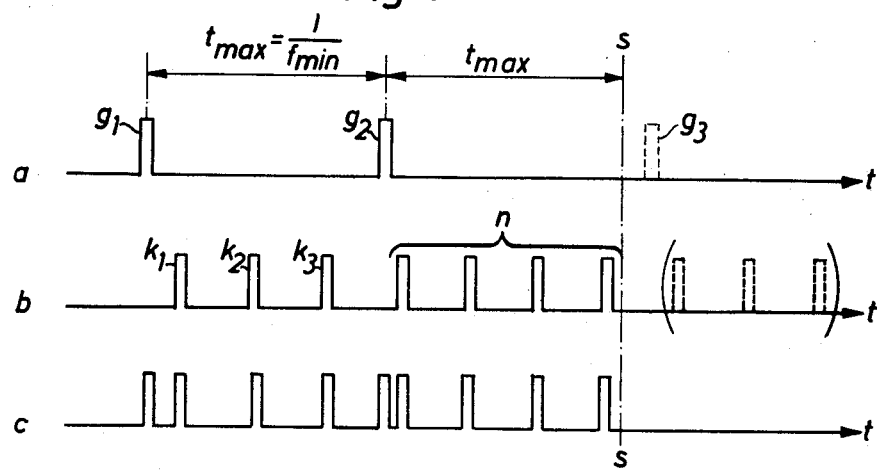
FIG. 3 is a pulse diagram and shows the transducer pulses and the correction pulses are superimposed according to the invention.

The conditions will be discussed more closely with reference to FIG. 3, which illustrates the occurring transducer and correction pulses, plotted along a time axis, the transducer pulses being shown at "$a$", the correction pulses at "$b$" and the collected or superimposed pulses at "$c$". The Figure illustrates the case where the transducer frequency moves towards its lowest value, whereat $g_1$ denotes a penultimate pulse, while $g_2$ denotes a terminal pulse sent with the frequency $f_{min}$. By $g_3$ is denoted a possibly occurring late pulse outside the working range. The correction pulses $k_1$, $k_2$ etc. are sent with a regular time interval according to the basic assumptions. According to the last of the above-mentioned conditions, the correction pulse train must be broken after the last transducer pulse $g_2$, whereat the break must not take place simultaneously with $g_2$, but first after a definite number $n$ of correction pulses has been sent corresponding to the time interval between the penultimate pulse $g_1$ and $g_2$. If the lowest transducer frequency is $f_{min}$, the maximum time interval between transducer pulses will thus be $t_{max}$, i.e. just at the boundry of the working range, such that $t_{max} = 1/f_{min}$. If the correction frequency is $f_k$, the number $n$ of correction pulses during this time will thus be $= t_{max} \cdot f_k = f_k/f_{min}$. As denoted by the vertical dotted line S in FIG. 3, the sending of correction pulses is broken off after $n$ such pulses have been sent after the last transducer pulse $g_2$. At "$c$" in FIG. 3, the appearance of the corrected pulse train is thus shown just before the moment when the transducer stops.

In this connection it is pointed out that by $f_{min}$ is generally intended the lowest point in the rectilinear portion of the transducer characteristic. As has already been indicated, in reality the transducer pulses will in certain cases be sent with a lower frequency then $f_{min}$, but then in a non-linear area outside the working range. Especially with the flow meters given as examples, the medium can have such a high vicosity that when the flow is diminishing the transducer or indicator will send pulses deviating from the linear characteristics to finally stop at a value $f'_{min}$, as indicated in FIG. 2. When the invention is put into practice, however, $f_{min}$ is always reckoned as being at the end of the rectilinear portion of the characteristic. It is further pointed out that in principle nothing is altered if frequency multiplication is used, i.e. if the output signal of the transducer is exposed to frequency multiplication, e.g. $u$ times. $f_k$ is hereby multiplied $u$ times as well, and the ratio $f_k/f_{min} = n$ will be unaltered.

Figure 4:
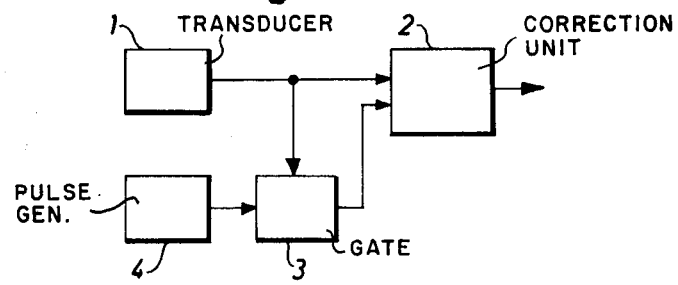
FIG. 4 shows a simple block diagram of a correction circuit arranged for carrying out the method according to the invention.

FIG. 4 is a general block diagram of an electronic circuit with the help of which the method according to the invention can be carried into effect. A transducer as above is denoted by the numeral 1, and is arranged to emit a pulse train with a frequency proportional to the measurement magnitude, e.g. the volume flow of a flow meter. The output of the transistor is connected to the input of a correcton unit 2 and to a control input of a gate circuit 3, the output of which is connected to a second input of the correction unit 2. A pulse generator 4 for generating correction pulses is connected to a second control input of the gate circuit 3. For the sake of simplicity, the four components are considered as separate units, while in practice they can be built together in different ways, possibly all four being in a single integrated circuit.

In agreement with the preceding, the circuit works so that the transducer pulses from the transducer 1 and the correction pulses from the generator 4 are superimposed in the correction unit 2 for further transmission to a counter or adder (not shown). As has been mentioned above, a simple superimposition of the pulses cannot take place however, and the correction unit 2 in combination with the gate 3 supervises that the above-mentioned conditions for superimposition are met.

With regard first of all to the "separation condition", which says that two pulses from the transducer 1 and the pulse generator 4 ocurring simultaneously must not be fed out as a single pulse, but must be separated where coincidental pulses are stored for successive output. If thus the output of one pulse is in process when another pulse is fed into the correction unit, the new pulse is queued in the memory. Transmitting the new pulse is first begun after a certain time has passed since the terminaton of the preceding pulse, for the purpose of providing sufficient separation between sequential pulses so that the adder used will safely note two pulses.

Meeting both the remaining conditions is supervised by the gate circuit 3, i.e. the coordination between both the pulse trains, signifying on the one hand that the correction pulses may not be transmitted "on their own" but are continuously transmitted in response to transducer pulses occurring first, and on the other hand that the correction pulses are limited when the "scarcity" between the transducer pulses has become so great that the lower boundary of the measuring range has been fallen short of. Hereby, the condition concerning the sovereignty of the transducer pulses is simply filled by the gate, which blocks or passes the correction pulses, only opening on triggering by a transducer pulse. To meet the remaining condition, the gate must obviously be so constructed that it breaks the correction pulse train if a transducer pulse is not present, i.e. if $g_2$ according to FIG. 3 is not followed by a pulse $g_3$, but should one or more such late pulses occur, only a predetermined maximum number of correction pulses is passed through for each such transducer pulse. The gate can hereby be arranged in two principly different ways, viz. its function is either based on measurement of the time or on counting pulses.

A time control or "timing" gate 3 functions so that each transducer pulse triggers the gate for keeping it open a certain maximum time $t_{max}$, which according to the preceding is equal to the inverted value of $f_{min}$. With transducer frequencies exceeding $f_{min}$, the gate will thus be open continuously.

Figure 5:
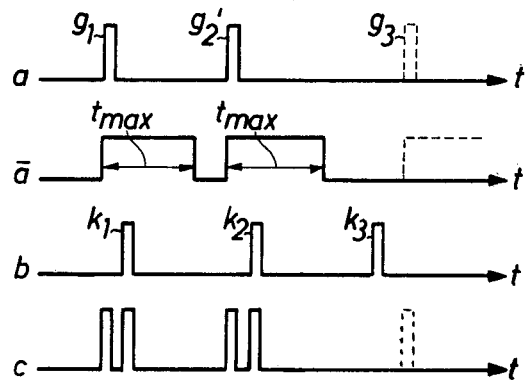
FIGS. 5 and 6 are pulse diagrams illustrating the superimposition of transducer pulses and correction pulses according to two alternative working methods of the circuit according to FIG. 4.

This situation is illustrated in FIG. 5, where the transducer output signal is shown at "a", and at "a" the gate function, i.e. this line shows those time intervals $t_{max}$ for which the gate is open. The correction pulses are shown at "b", and at "c" is shown the resulting output signal from the correction unit. As may be seen, the pulse $g_1$ triggers the gate open, and this will thereby let through a subsequent correction pulse $k_1$. The next transducer pulse $g'_2$ is assumed to come somewhat too late due to the transducer having stopped for a moment, so that the gate has had time to close, but $g'_2$ opens it again so that the subsequent correction pulse $k_2$ is passed. The correction pulse $k_3$ subsequent thereon is not passed since the gate has once again had time to close, and pulse $g_3$ is assumed to be excluded.

Figure 6:
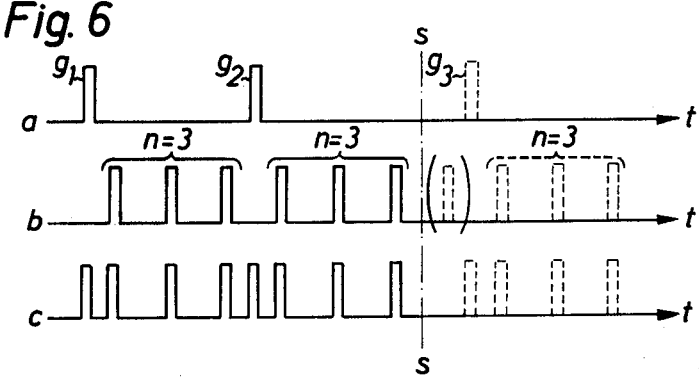

In FIG. 6 the conditions are illustrated when the gate is designed so that it functions by counting, which means that it consistently passes through at most a certain number of correction pulses $n$ determined by $n = f_k/f_{min}$, it being assumed in this case that $n = 3$. As before, the transducer pulses are indicated at "a", the correction pulses at "b" and the superimposed pulses at "c". The transducer pulse $g_2$ triggers the gate open and three correction pulses are passed through, thereafter input is blocked as indicated by the line S, since no further transducer pulses occur. Should a late pulse $g_3$ occur through, it triggers by itself three correction pulses, and this situation is illustrated by dotted lines to the right of the line S. In this connection it is pointed out, however, that both in FIG. 3 and FIG. 6 the correction frequency has been shown several times larger than the transducer frequency for the sake of clarity. In reality both frequencies are of the same order of magnitude, i.e. $n \approx 1$; sometimes $f_k$ is even smaller than $f_g$.

The last mentioned method means a certain approximation, since the given number of pulses passed by the gate shall correspond to the number which was previously defined as $n = f_k/f_{min}$, and this quotient must thus be rounded off to the nearest positive integer. Without any great difficulty the gate can, however, be modified so that the average value of the number of pulses passed through attains the desired value $n$. For this purpose the gate is supplemented by a memory which causes it to pass a number N or K of pulses which is respectively sometimes rather greater and sometimes rather less than $n$, so that the average value of several throughputs converges towards $n$.

A simple numerical example illustrates the principle. Assume that the quotient $f_k/f_{min}$, i.e. the desired number of correction pulses $n$ is 2.6, which is the same as (15/3) or 2 (3/5). The gate shall then be arranged so that three correction pulses are put through three times out of five, while the remaining two times only two pulses are put through. The average value over a long series of transducer pulses will then obviously be 2.6.

A practical embodiment example of an electronic circuit by means which the invention can be exercised while fulfilling the aforementioned three conditions of frequency superimposition will now be described with reference to FIG. 7. The components of the circuit comprise standard units of IC character (integrated circuits), and as to the function of the circuit it deviates from that of the circuit outlined in FIG. 4 in that the transducer pulses are not directly superimposed on the correction pulses. Instead, they trigger the emittance of secondary transducer pulses from the same source which delivers the correction pulses. These secondary pulses and the correction pulses are added and further treated for providing a corrected output signal, as will be described in the following.

Figure 7:
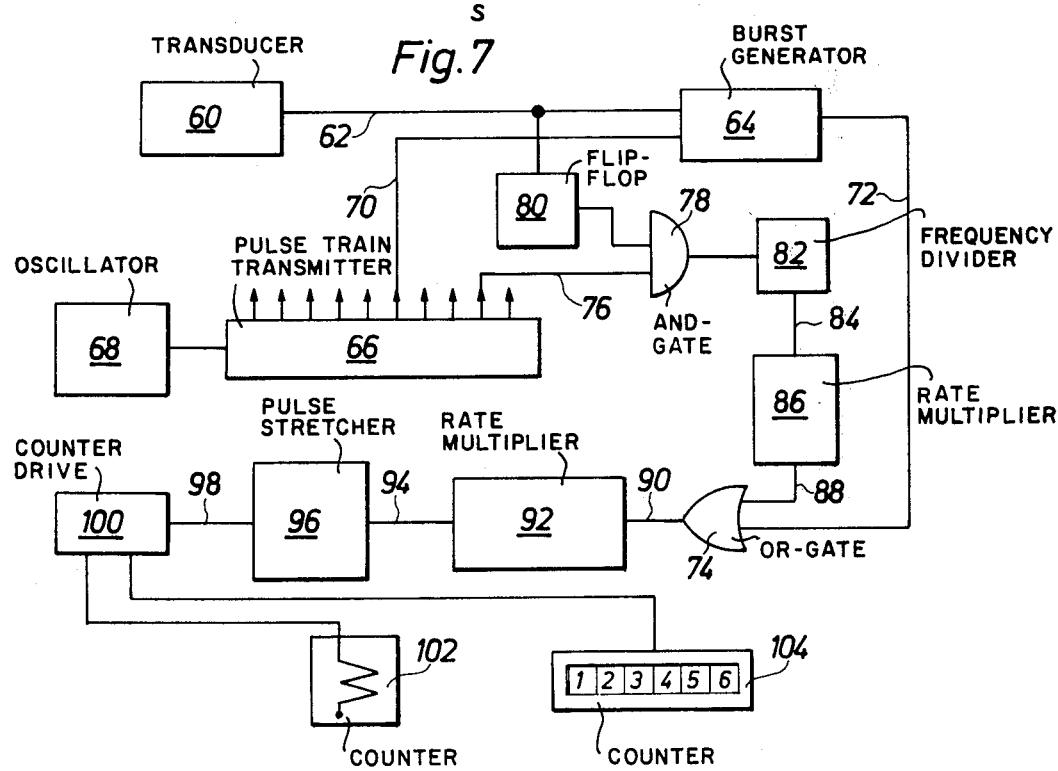
FIG. 7 is a detailed block diagram showing a further embodiment of the correction circuit for carrying out the invention.

Thus, with reference to FIG. 7, from a transducer 60 (e.g. a flow meter of the type referred to above) an analogue signal is emitted, which in a suitable way is amplified and converted into a pulse shaped signal 62. This is supplied to a so called burst generator 64 which has the characteristic that it emits, upon reception of an input pulse, a burst of pulses, for example 10. The burst generator 64 receives the pulses for such burst from a timed pulse train transmitter 66 which is fed from a crystal oscillator 68 supplying a high base frequency, e.g. 1 MHz. More particularly, the pulse train transmitter 66 has the characteristic that it, first, lowers the frequency of the pulses received from the oscillator 68, e.g. by a power of 10, and, secondly, delivers from a number of output terminals the same number of pulse trains exhibiting the reduced frequency, the pulse trains being displaced in time relative to each other. This pulse train transmitter may comprise e.g. a decoded decade counter, known in the art. From one of said output terminals a pulse train 70, thus in this case having the frequency of 100 kHz, is lead to the burst generator 64 for chopping. Thus each time the burst generator receives a transducer pulse it will deliver a burst 72 of, in this example, 10 pulses, the frequency of the pulses within the burst thus being 100 kHz. The bursts 72 are conducted to an OR-gate 74.

Reverting to the timed pulse train transmitter 66, there is taken from another output terminal thereof another pulse train 76 (this train also having the frequency of 100 kHz but being time displaced in relation to the pulse train 70). This pulse train 76 is utilized for generating the necessary correcton signals. Two gating arrangements (timing, counting) for generating correction signals are discussed above with reference to FIGS. 5 and 6. In the FIG. 7 example, pulse train 76 is lead to an AND-gate 78. This gate opens in dependence on the transducer signals 62, as these signals are supplied not only to the burst generator 64 but are also supplied to a retriggerable monostable flip-flop 80. The latter opens, upon each transducer pulse received, the gate 78 during a predetermined time for passage of the pulse train 76. By the flip-flop 80 the first and the third of the above mentioned conditions are fulfilled, viz., that no correction pulses may be generated before a transducer pulse has appeared, and that the correction pulses are not allowed to proceed unlimitedly after emittance of transducer pulses have terminated.

After the gate 78 the pulse train 76 continues to a frequency divider 82 which lowers the frequency of the train, in this case 100 times, so that the outgoing pulse train on line 84 has the frequency 1 kHz. Next follows a so called rate multiplier (RMP) 86 which in known manner is adjusted, by means of decade thumb wheels, to deliver a desired frequency, see below, and the signal 88 delivered (i.e. $10 f_k$) is added in the OR-gate 74 to the transducer dependent signal 72 from the burst generator 64.

As shown in the aforegoing, a corrected transducer frequency $f_{g\ korr}$ is to be obtained which is equal to $f_g + f_k$, where $f_k$ is to be adjusted such that the line representing $f_{g\ korr}$ in the diagram cuts the origin, see FIG. 2. In this case a value of $f_k$ adapted to the meter under consideration is set on the rate multiplier 86, it being taken into account that the signal 72, in fact, represents $10 f_g$. The combined signal 90 leaving the gate 74 will thus be $10(f_g + f_k)$.

The second of the necessary conditions for correction of the transducer signal, viz., that the transducer pulses and correction pulses always must be separated so that they do not coincide in adding, is fulfilled automatically in the circuit according to FIG. 7 by the fact that the transducer pulses or, rather the transducer dependent pulses, and the correction pulses have the same source, namely the high frequency oscillator 68, whose pulses have been divided into equal but time-displaced trains, of which two are used for generating secondary transducer means and correction pulses, respectively.

The corrected signal 90 is treated in a further rate multiplier 92 which adjusts the signal by the dimension factor K, that is, so that the signal 94 delivered from the multiplier obtains such a frequency $K \cdot 10(f_g + f_k)$ that the pulses of the signal, which are intended for counting, will correspond directly to the desired magnitude of measurement, for example 1/min. As the pulses may lie so close (although never coinciding; there will always be a minimum time spacing of 1 μs in view of the frequency of their common origin, 1 mHz) that many counters, in particular electromechanical counters, do not catch up, the signal 94 is treated in a pulse stretching device 96. This can most simply be described as a device capable of changing, on the one hand, the time interval between incoming pulses and, on the other hand, the width or duration of the pulses themselves, without changing their total number. Such an effect may be obtained by means of an up/down counting process, and the device 96 is thus based on an up/down counter known in the art. In the signal 98 leaving the stretching device 96 and passing to a counter driving stage 100, the time spacing as well as the duration of the pulses are thus so great that a mechanical or electronic counter 102 or 104, respectively, manages to count them without difficulty.

The circuit of FIG. 7 has been exemplified by means of components which modify the frequency of the occurring signal in a specific manner, for example the train pulse transmitter 66 and the frequency divider 82, and further a common pulse source having a frequency of 1 mHz has been selected. It is pointed out, however, that the values stated have been chosen for illustration and that the circuit can be arranged to operate at other values if necessary for practical reasons, while the principle of the circuit arrangement remains unchanged.

A great advantage with the arrangement according to the invention, in particular when exercised by means of the circuit of FIG. 7, is that the correction pulse frequency can easily be modified to compensate varying outer conditions which affect the measuring values. In flow meters, for example, varying temperature can cause variation in the viscosity of the medium flowing through, and measuring error caused thereby can thus be corrected by the frequency of the correction pulses being changed with the temperature, in doing which this correction may take place automatically with the temperature as controlling factor. Furthermore, the frequency can be modified with regard to manufacturing deviations between different examples of the same transducer type, for the purpose of perfecting the accuracy of each individual instrument.

I claim:

1. A method for correcting an output signal from a digital transducer for measuring a physical magnitude, wherein said output signal is a pulse train of frequency $f_g$, the transducer frequency $f_g$ being essentially a straight line function of said physical magnitude within the working range of said transducer, said transducer having the inherent quality that in a graphical portrayal of said function including axes representing the transducer frequency and said physical magnitude an extension of said straight line beyond said working range cuts said transducer frequency axis at a point to one side of the zero point of such axis, said method including the step of superimposing a correction pulse frequency of $f_k$ on said transducer pulse frequency $f_g$ to thereby obtain a corrected transducer pulse frequency $f_{g\ korr}$ wherein said corrected transducer pulse frequency $f_{g\ korr}$ is also graphically portrayable as a straight line function of said physical magnitude, said method including the further step of adjusting said correction frequency $f_k$ such that said straight line representation of said corrected transducer pulse frequency $f_{g\ korr}$ cuts substantially through said zero point, the method further comprising:

a. providing a base pulse train of a predetermined frequency;

b. dividing said base pulse train into at least two pulse subtrains, the pulses of one subtrain being displaced in time in relation to the pulses of the other subtrain;

c. said transducer pulses gating pulses of one of said subtrains to produce correction pulses;

d. said transducer pulses also gating pulses of the second of said subtrains to produce for each transducer pulse a predetermined number of secondary transducer pulses; and e. superimposing said correction pulses and secondary transducer pulses to obtain a resultant corrected pulse train of a frequency whose function of said physical magnitude is graphically represented by a straight line substantially cutting through said zero point.

2. The method of claim 1, in which the step of gating the pulses of said one substrain with said transducer pulses to produce correction pulses includes limiting the number of correction pulses produced for each transducer pulse when the transducer frequency falls below its lowest operating value.

3. The method of claim 2, in which said limiting of the number of correction pulses includes emitting said correction pulses only during a period of time not exceeding the time between consecutive transducer pulses at said lowest operating frequency.

4. The method of claim 2, in which said limiting of the number of correction pulses includes limiting the number of correction pulses emitted to a number $n$ not greater than the quotient of the correction frequency and said lowest operating transducer pulse frequency.

5. The method of claim 4, in which the correction pulses are emitted alternatingly equal to whole numbers N and K, N being the whole number immediately exceeding said number $n$ and $K$ being the whole number falling immediately below said number $n$, such that the average number of correction pulses per transducer pulse approaches $n$.

6. The method of claim 1, in which the corrected pulse train resultant of the superimposition of said correction pulses and secondary transducer pulses is subjected to a stretching operation to the effect that the time interval between the pulses of the train as well as the width or duration of each pulse is increased without the total number of the pulses being changed.

7. A device for correcting an output signal formed as a pulse train and which includes a digital transducer for measuring a physical magnitude and producing a pulse frequency $f_g$ indicative of the measured physical magnitude, the transducer pulse frequency $f_g$ being essentially a straight line function of said physical magnitude within the working range of said transducer, said transducer having the inherent quality that an extension of said straight line outside said working range cuts the transducer frequency axis at a place to one side of the transducer frequency zero point, said device further comprising:

a base pulse generator for generating pulses at a base frequency;

a pulse train transmitter fed by said base pulse generator for producing at least two pulse subtrains, the pulses of one subtrain being displaced in time in relation to the pulses of the other subtrain;

first gating and converting means responsive to a said transducer pulse for controllably feeding parts of one of said pulse subtrains for producing correction pulses at a correction frequency $n \cdot f_k$, $n$ being a positive number;

second gating and converting means also responsive to said transducer pulse for controllably feeding parts of the second of said pulse subtrains for producing secondary transducer pulses at a frequency $n \cdot f_g$; and an addition unit for producing a corrected pulse train including the secondary transducer pulses and the correction pulses to obtain a corrected transducer pulse frequency $n \cdot f_{g\,korr} = n \cdot f_k + n \cdot f_g$, or $f_{g\,korr} = f_k + f_g$, the value of $f_k$ being determined such, by said first gating and converting means, that the resulting $f_{g\,korr}$ characteristic cuts essentially through said zero point.

8. A device as claimed in claim 7, in which said first gating means is arranged to pass correction pulses, after reception of a transducer pulse, during a period of time not exceeding the time between consecutive transducer pulses at their lowest operating frequency.

9. A device as claimed in claim 7, in which said first gating means is arranged to pass correction pulses, after reception of a transducer pulse, to a number on an average not greater than the quotient of the correction frequency and said lowest operating transducer pulse frequency.

10. A device as claimed in claim 9, in which one of said gating and converting means comprises means responsive to reception of a transducer pulse for feeding therethrough a number of successive pulses from the corresponding one of said pulse subtrains.

11. A device as claimed in claim 7, in which said first gating and converting means comprises a gate fed said one pulse subtrain, a retriggerable monostable means responsive to a said transducer pulse for opening said gate for passage of said pulse subtrain for a predetermined time, and controlled frequency changing means at the pulse subtrain output of said gate for supplying said correction pulses at said correction frequency, said second gating and converting means including generator means responsive to a said transducer pulse for delivering a number of successive second subtrain pulses, said addition unit comprising a further gate having inputs connected both to said generator and to said frequency changing means for adding the frequencies thereof to provide a pulse signal proportional to said corrected transducer pulse frequency, said addition unit further including rate multiplier and pulse stretcher means for providing a proportionally adjusted frequency and stretch pulse version of the output of said last mentioned gate.

* * * * *